(12) United States Patent
Fournel et al.

(10) Patent No.: US 8,501,589 B2
(45) Date of Patent: Aug. 6, 2013

(54) METHOD IN THE MICROELECTRONICS FIELDS OF FORMING A MONOCRYSTALLINE LAYER

(75) Inventors: Franck Fournel, Villard-Bonnot (FR); Thomas Signamarcheix, La Terrasse (FR); Laurent Clavelier, Grenoble (FR); Chrystel Deguet, Saint Ismier (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 285 days.

(21) Appl. No.: 13/125,951

(22) PCT Filed: Oct. 29, 2009

(86) PCT No.: PCT/FR2009/052096
§ 371 (c)(1),
(2), (4) Date: Apr. 25, 2011

(87) PCT Pub. No.: WO2010/049657
PCT Pub. Date: May 6, 2010

(65) Prior Publication Data
US 2011/0201177 A1    Aug. 18, 2011

(30) Foreign Application Priority Data
Oct. 31, 2008   (FR) .................................... 08 06071

(51) Int. Cl.
*H01L 21/00*   (2006.01)
(52) U.S. Cl.
USPC ......................................... 438/459; 438/455
(58) Field of Classification Search
USPC ................................ 438/455–459
See application file for complete search history.

(56) References Cited

U.S. PATENT DOCUMENTS

| 6,251,754 | B1 | 6/2001 | Ohshima et al. |
| 8,053,330 | B2 * | 11/2011 | de Souza et al. ............... 438/455 |
| 2006/0068563 | A1 | 3/2006 | Wong et al. |

FOREIGN PATENT DOCUMENTS

FR   2907966 A1   10/2006

OTHER PUBLICATIONS

Hochbaum et al., "Controlled Growth of Si Nanowire Arrays for Device Integration", *Nano Lett.*, vol. 5, No. 3, 2005, pp. 467-460.
Peng et al., "Aligned Single-Crystalline Si Nanowire Arrays for Photovoltaic Applications", *Small* 2005, 1, No. 1, pp. 1062-1067.
Peng et al, "Fabrication of Single-Crystalline Silicon Nanowires by Scratching a Silicon Surface with Catalytic Metal Particles", *Adv. Funct. Mater*, 2006, 16, pp. 387-394.
Schmidt et al., "Realization of a Silicon Nanowire Vertical Surround-Gate Field-Effect Transistor", *Small* 2006, 2, No. 1, pp. 85-88.
International Search Report Dated Feb. 15, 2010.

* cited by examiner

*Primary Examiner* — Richard Booth
(74) *Attorney, Agent, or Firm* — Brinks Hofer Gilson & Lione (57) ABSTRACT

A process for forming a thin film of a given material includes providing a first substrate having, on the surface, an amorphous and/or polycrystalline film of the given material and a second substrate is bonded to the first substrate by hydrophobic direct bonding (molecular adhesion), the second substrate having a single-crystal reference film of a given crystallographic orientation on the surface thereof. A heat treatment is applied at least to the amorphous and/or polycrystalline film, where the heat treatment causes at least a portion of the amorphous and/or polycrystalline film to undergo solid-phase recrystallization along the crystallographic orientation of the reference film, where the reference film acts as a recrystallization seed. The at least partly recrystallized film is then separated from at least a portion of the reference film.

15 Claims, 3 Drawing Sheets

METHOD IN THE MICROELECTRONICS FIELDS OF FORMING A MONOCRYSTALLINE LAYER

Related subject matter is disclosed in co-pending, commonly-assigned patent application titled "Method Of Producing A Hybrid Substrate Having A Continuous Buried Electronically Insulating Layer" filed on even date herewith as a U.S. Nationalization of PCT Application No. PCT/FR2009/052091.

TECHNICAL FIELD

The invention concerns, in the field of microelectronics (in the broadest sense of the term, including in particular micro-mechanical, micro-acoustic, micro-optical, etc. components) the formation of a monocrystalline layer of any thickness.

BACKGROUND

In practice, the formation of a microelectronics component implies various steps involving layers of a few nanometers to a few microns, or even of a tens of microns, in which all or part of the components are formed. The material most used in this field is silicon, but other materials are also used, such as germanium (and its alloys with silicon), gallium and its alloys (in particular gallium arsenide), and other elements of group IV of the periodic table of the elements, and even compounds of III-V type, or even II-VII. A certain number of these components are semiconductors, which explains why they are used in the microelectronics field.

The formation of such microelectronics components often involves a step during which a layer of silicon on insulator, abbreviated to SOI, is formed, that is to say a useful layer of monocrystalline silicon on an insulating layer which defines one of the faces of the layer; since the microelectronics field has opened up to materials other than silicon, the expression SOI has continued to be used even when the useful layer is of a material different from silicon. Below, numerous explanations are given in the case of silicon, but it is to be understood that they can be generalized to other materials in the microelectronics field.

There are several methods for manufacturing an SOI type layer.

Thus, it is known to thermally oxidize a wafer of silicon (generally monocrystalline silicon) in order to transform it wholly or partly into silicon oxide. This first wafer is then bonded, in particular by molecular bonding, to a second wafer of silicon (generally of monocrystalline silicon); it then suffices to make one or other of the wafers thinner to obtain a layer of silicon on a layer of silicon oxide. This thinning is generally carried out by means of grinding followed by chemical mechanical polishing. Such a technique enables a layer of silicon to be obtained with a wide range of thicknesses; in particular it is thereby possible to obtain layers as thick as desired; however, it proves to be difficult to obtain a good level of homogeneity of thickness (typically a thickness only varies +/− 10% relative to the average value) below the order of 5 microns thickness, it being recalled that a wafer, in the microelectronics field, is typically a disk the diameter of which is of the order of 200 to 300 nm, or even greater.

When it is desired to obtain thinner films of silicon for which the thickness is well controlled, it is known to use a technique known under the name "Smart Cut"™ which, in a simplified version, consists in implanting a silicon wafer oxidized at the surface (with a thermal oxide layer of silicon which typically has a thickness of approximately 145 nm) with hydrogen ions, in bonding that wafer, for example by molecular bonding, onto another silicon wafer, then of inducing separation within the assembly so obtained, at the implantation peak, for example using thermal annealing, so as to obtain a thin film of silicon on a layer of silicon oxide (i.e. the part of the original wafer situated between the implantation face and the location of the implantation peak). An important advantage of this technique is that the original wafer, after separation of that thin film joined to the oxide layer, may be recycled for the formation of other thin films, which is very worthwhile in terms of cost relative to the preceding technique which involves consuming the entire substrate apart from the desired layers. With this "Smart Cut"™ technique, small thicknesses may be obtained, between a few nanometers and a few microns with a very good level of homogeneity (typically at most equal to 1%). However, this technique is poorly adapted for obtaining layers of more than 3 microns, since the thickness of the hybrid layer which is separated corresponds to the depth of implantation; it can be understood that there are limits to this thickness, given that implantations of ions are generally carried out at 200 KeV at most (which for silicon corresponds to an implantation peak at around 2.5 μm). It is of course possible to make up the layer so obtained by growth of the thin film by epitaxy until the desired thickness is reached, but the overall cost then becomes greater than that of the first technique cited above.

Another technique to obtain layers of SOI type is known under the name "Eltran"®, which consists in producing, in a silicon wafer, a layer of porous silicon, then in growing a film of monocrystalline silicon by epitaxy on that porous film. The surface of this film is next oxidized thermally, then bonded, for example by molecular bonding, onto a second silicon wafer, then a fracture is induced within the porous layer so as to transfer the monocrystalline silicon film onto that second wafer. It can be understood that, like the "Smart Cut" ™ technique, this technique enables very thin layers to be obtained with a good level of homogeneity, as well as the recycling of the part of the original wafer from which the thin film separated. However, this technique is relatively expensive, given the cost of the steps of forming porosity and epitaxy, such that this technique is in practice usable only for thicknesses below a few microns.

Thus the three aforesaid techniques each have limitations. The first only enables thick films to be formed (5 microns and beyond, in practice) while having a high cost due to the consumption of the unused part of the wafers employed, whereas the following two techniques consume less material, but implement relatively expensive steps; furthermore they are limited to small thicknesses (3 microns and below).

SUMMARY

An object of the invention is to provide a method of forming a thin layer enabling monocrystalline layers to be obtained with a wide variety of materials in the field of microelectronics, in a wide range of possible thicknesses encompassing the ranges of each of the aforementioned techniques (thus a range going from a few nanometers to several tens, or even hundreds, of microns), with a good level of homogeneity at the scale of a wafer, typically over at least ten or so centimeters, and for a moderate cost.

The invention thus provides a method of forming a thin layer of a given material, comprising, preparing a first substrate comprising, on the surface, an amorphous and/or polycrystalline layer of said given material, bonding to that first substrate, by hydrophobic molecular bonding, a second substrate comprising a surface monocrystalline reference layer, having a given crystallographic orientation, applying at least to the amorphous and/or polycrystalline layer a heat treatment adapted to induce the recrystallization in solid phase of at least part of that amorphous and/or polycrystalline layer following the crystallographic orientation of the reference layer, that reference layer acting as a recrystallization seed, and separating the at least partly recrystallized layer from at least part of the reference layer.

The separation preferably occurs from the entirety (or almost the entirety) of the reference layer.

Thus, according to the invention, transmission of the crystalline information through a bonding interface occurs and the separation advantageously takes place along (or in immediate proximity to) the bonding interface.

It is to be noted that the method of the invention does not require the implementation of an implanting step.

Preferably, the first substrate is prepared such that the amorphous and/or polycrystalline layer extends along an underlying layer that is adapted not to recrystallize at the time of the heat treatment, an advantage which this may have being to well delimit the surface of the recrystallized layer on the opposite side to that which is bonded to the second substrate. That layer will in general be chosen according to the intended application: it will preferably be a dielectric layer, for example an oxide layer, such as a layer of an oxide of the material of the amorphous layer if it is desired to produce a SOI in particular.

Thus, the invention uses a layer temporarily added onto an amorphous and/or polycrystalline layer as a recrystallization seed for the latter, which gives great freedom in the choice of the crystal form to obtain, depending on the crystallographic characteristics of the seed-forming reference layer.

It can be understood that this technique is distinguished in particular from the "Eltran"® technique by the fact that it does not involve the implementation of epitaxy on a porous surface (excluding neither the formation of a layer by epitaxy, for example a sacrificial layer, nor the employment of a porous layer, as commented upon below); furthermore, the continuity of the crystalline network is made across a bonding interface.

In fact, another option to attempt to form layers of SOI type by recrystallization would consist in depositing amorphous silicon on a silicon oxide layer and of applying to the amorphous silicon a heat treatment sufficient to induce the recrystallization. However, experience shows that such spontaneous recrystallization would only occur at a small scale, not exceeding a few tenths of a centimeter along the insulating layer; in other words, spontaneous recrystallization would not in practice enable the formation of a monocrystalline layer over a wide section like those of the wafers used in microelectronics. To attempt to overcome such a difficulty, the technique referred to as ELOG or ELO (Epitaxy Lateral Overgrowth) provides to form holes in the oxide layer before the deposit of the amorphous silicon; thus, on deposit of that amorphous silicon, a part thereof comes into contact with the material situated under that insulating layer, for example monocrystalline silicon. According to the recrystallization conditions, the monocrystalline character of the substrate situated under the insulating layer may "rise" through the holes of that insulating layer to reach the recrystallized layer, around those holes. However, a drawback of this seeding of the recrystallization from holes is that this recrystallization does not occur in a well-controlled manner at a distance from those holes (hence polycrystalline recrystallization); furthermore, a drawback of this option is that the insulating layer is no longer continuous, which may adversely affect good definition of the thickness of the recrystallized layer at the location of those holes.

It can be understood that the molecular bonding promotes the seed role provided by the reference layer, whereas bonding by addition of material (adhesive or resin in particular) would constitute an obstacle for such a seed role (this does not prevent the presence of a thin sacrificial layer, as indicated below).

The recrystallization seed-forming reference layer is advantageously porous over at least part of its thickness, which has the advantage of constituting a "weak" zone in which the separation may be made by fracture. In other words, according to one option, the preparation of the second substrate, the molecular bonding and the heat treatment for recrystallization are such that this second substrate comprises, preferably along the interface, a zone of which the mechanical strength is less than that of the bonding interface.

When the reference layer is dense and homogenous (that is to say non-porous), the separation is advantageously obtained by unbonding at the bonding interface or by the "Smart Cut"™ technology.

To facilitate such unbonding at the bonding interface, the molecular bonding is advantageously carried out such that the bonding energy at the interface between the bonded faces remains low, even after the annealing for recrystallization of the amorphous layer. For this, it may be provided to roughen the surface of one of the surfaces forming the interface, on the amorphous layer or the seed-forming layer, or even to roughen each of those surfaces, with sufficiently low roughness to enable molecular bonding to be obtained and sufficiently strong to enable easy separation after annealing for recrystallization.

Such roughness may for example be obtained by engraving the surface of the seed-forming layer, or that of the amorphous layer. In the case of a layer of monocrystalline silicon, this engraving is advantageously obtained in a solution of water, ammonium hydroxide and hydrogen peroxide ($H_2O$, $NH_4^+/OH^-$ and $H_2O_2$) in the proportions 1-1-5, at 70° C. for 5 min, or even 10 min (it is within the capability of the person skilled in the art to choose an appropriate solution for each material to engrave). Roughness may thus be obtained which is typically approximately 0.2 nm RMS (root mean square) measured by AFM (atomic force measurement) on a surface measuring 5 microns×5 microns; this roughness is preferably controlled so as to be comprised between 0.1 nm RMS and 1 nm RMS.

Instead of modifying the roughness of the layers destined to be bonded, a sacrificial layer may be provided between these two surfaces, provided this layer keeps the crystalline information to transmit and thereby enables the seed-forming layer to provide its role in the recrystallization. By way of example, this sacrificial layer may be an alloy of the two materials constituting the amorphous and/or polycrystalline layer and of the seed-forming layer, which is formed by epitaxy on the seed-forming layer, for example $Si_xGe_{(1-x)}$ in the case of an amorphous layer of silicon bonded to a seed-forming layer of silicon or of germanium. Where it is desired to recrystallize an amorphous film of silicon by a monocrystalline silicon seed, it will be possible to deposit a sacrificial thin film of SiGe on the seed. That layer will have to be of smaller thickness than the critical thickness (thickness up to which SiGe grows with the lattice parameter of the underlying silicon, thereby conserving the crystalline information of the silicon; for $Si_{0.8}Ge_{0.2}$ on Si, limitation is typically made to a thickness of 5 nm. After bonding and annealing for recrystallization, to obtain the separation, it then suffices to eliminate a large part of the seed substrate, for example by mechanical grinding or by fracture situated at a buried weak zone formed in advance in the seed substrate, then to employ one or more selective attack solutions of any appropriate known type to eliminate the residual part of the seed, if any, then the sacrificial layer of SiGe (a known solution for example for selectively engraving SiGe relative to silicon is $HF/HNO_3$).

To facilitate the unbonding, it will also be possible to limit the thermal budget of recrystallization (which tends at the same time to reinforce the bonding interface). It may for example be envisaged to recrystallize only a small part of the thickness of the amorphous and/or polycrystalline layer, starting from the bonding interface, to limit the duration of application of the recrystallization treatment, then to carry out the unbonding (provided that the bonding interface has moderate strength) then to continue and complete the recrystallization of the amorphous and/or polycrystalline layer by application of a complementary thermal budget. This enables the pre-unbonding thermal budget to be limited (and thus to ensure that the structure will be unbondable) while transferring the crystalline information "from the other side" of the bonding interface. It is to be recalled that the concept of thermal budget encompasses both the temperature of a treatment and its duration.

Such recrystallization in two treatment steps, with a first treatment which is adapted to cause the recrystallization of only a part (in practice, part of the thickness) of the amorphous and/or polycrystalline layer and, after separation, the application of a second heat treatment (or even of several heat treatments) adapted to continue and complete the recrystallization of the amorphous and/or polycrystalline layer, also has, independently of the location at which the separation is made, an energetic advantage since the complementary heat treatment does not need to be applied to the seed-forming layer.

It can easily be understood that, even though it is advantageous, it is not necessary for the recrystallization to be obtained, throughout the layer to recrystallize, over the same part of the thickness of that layer; it suffices for the part of that layer which is recrystallized to be sufficiently great to serve as a seed for the rest of the layer, at the time of the heat treatment subsequent to the separation.

It was stated above that the molecular bonding of the amorphous and/or polycrystalline layer and of the seed-forming layer is hydrophobic; as a matter of fact this is the best way (or even the only way) of obtaining good and full transmission of the crystalline information across the bonding interface; it has however been found that, if one of the surfaces is hydrophilic, the oxide present at the interface prevents good transmission of that crystalline information.

When the seed-forming layer is porous, it is in practice formed from a single crystal (of silicon, for example, if forming a porous layer of silicon is desired), but in a much simpler (and economical) manner than when surface compatibility with epitaxy has to be ensured, as is required in the "Eltran" technique which requires relatively low surface porosity, which in general makes it necessary to manage two levels of porosity and to perform a supplementary annealing operation to fill the surface.

The thickness of the seed-forming layer is advantageously comprised between a few nanometers to several hundred microns, preferably greater than 1 micron.

On advantage of choosing different materials for the amorphous and/or polycrystalline layer and for the seed-forming layer is that it is then possible, if desired, to cause the recrystallization of the amorphous and/or polycrystalline layer with a crystal form (in particular as regards the lattice parameters) imposed by the seed-forming layer which corresponds to a pre-stress. Thus, for example, the use of relaxed $Si_{0.8}Ge_{0.2}$ as seed for a layer of amorphous silicon contributes to forming a recrystallized layer of silicon under tension.

The underlying layer, for example a dielectric layer (see above) is advantageously of a thickness which may range from a few nanometers to several microns.

It may be formed at the surface of another underlying layer, whether crystalline or not.

It may be an oxide layer, for example a thermal oxide obtained by thermal oxidation of a carrier substrate (for example a wafer), for example of silicon oxide formed at the surface of a silicon substrate. As a variant, this underlying layer may be deposited on a carrier substrate which makes it possible to independently choose the materials constituting that layer and the carrier substrate; by way of example, the carrier substrate may be of quartz or of fused silica while the underlying layer is of silicon oxide deposited for example by PECVD.

The material of this underlying layer may, in fact, be chosen from a wide range of materials, provided it is compatible with the recrystallization steps; thus it may not only be an oxide of the material constituting the carrier substrate or the starting substrate, but may also be a nitride (for example of silicon or of aluminum), be of a material chosen for its high dielectric constant ($HfO_2$ for example), or be of diamond, etc. It may be formed from several layers produced successively.

It can be understood that this carrier substrate may be formed from any appropriate material, different from or on the contrary identical to that of the seed-forming layer, provided it is compatible with the recrystallization steps. An advantage of choosing a material different from that of the seed-forming layer is to be able to choose for that substrate a chosen specific characteristic, for example a different temperature coefficient from that of the seed layer; this in particular makes it possible to manage the creation of stresses within the structure (that is to say the set of layers after assembly). It is also possible to choose the material constituting that substrate so that it is transparent, flexible, etc. Thus the carrier substrate or starting substrate may be of germanium, or silicon carbide, of glass, of quartz, of fused silica, etc. according to need.

That underlying layer is not necessarily a layer formed on a carrier substrate or in a starting substrate; that underlying layer may indeed be sufficiently thick by itself to constitute a carrier substrate for the amorphous and/or polycrystalline layer; thus, for example, the amorphous and/or polycrystalline layer may be a layer of germanium on a silicon substrate, which is bonded to a second seed-forming substrate of germanium. For the amorphous and/or polycrystalline layer it is thus possible to choose the same material as that of the underlying substrate; in this case, advantageously, a different crystallographic orientation is chosen for the seed-forming layer to that of the carrier substrate, such that the amorphous and/or polycrystalline layer recrystallizes with a different orientation from that of its support; by way of example, it is possible to obtain a layer of orientation <110> on a substrate of the same material but of orientation <100> by recrystallizing a layer of amorphous (and/or polycrystalline) silicon with a seed of orientation <110>.

It is to be noted that the deposit of the amorphous layer may be carried out in a kiln over several substrates or wafers at the same time, at low temperature and at atmospheric pressure, contrary to epitaxy which is carried out wafer by wafer at high temperature and under a strong vacuum. This treatment of deposition in amorphous form is thus collective and enables a very considerable time saving relative to deposition by epitaxy. It is also a technique which is simple to implement, such that its manufacturing cost is low. The thickness of the amorphous layer is easy to control, since the thickness of that layer may, at will, be small or great, according to the deposition time in the kiln. Similar comments may be made with regard to a polycrystalline layer.

It has been stated that the layer to recrystallize is amorphous and/or polycrystalline (that is to say not monocrystalline); the case of an amorphous layer is of great practical interest, but there are applications in which the invention may usefully be applied to the recrystallization of polycrystalline layers (in whole or in part, the remainder being amorphous not monocrystalline), for example in the field of solar applications, in which it is known to form ingots of polysilicon which are subsequently cut up; it may then be useful to transform the surface polysilicon into monocrystalline silicon.

The annealing for recrystallization is advantageously carried out between 200° C. and 1300° C., for a duration comprised between a few fractions of seconds and several hours, in the case of an amorphous layer of silicon.

As stated above, this recrystallization annealing may be carried out in two steps (or more), typically by reducing the duration of the treatment before separation.

It has been stated that the separation carried out after recrystallization may be made in the second substrate, within the seed layer (near the recrystallized layer), in particular when the latter is porous or, as a variant, by unbonding of the bonding interface (in relation to which it is understood that this has the advantage of not requiring the elimination of a residual part of the seed-forming layer (and thus of the second substrate)).

It may be understood that, in both cases, the second substrate may be re-used for new cycles during which the superficial zone of that second substrate serves as a seed for the recrystallization.

The separation of the seed-forming layer may be carried out by the mechanical insertion of a tool (for example a blade) or by a fluid (in particular, gas or water), or by acoustic waves, at least within the weak zone constituted by (or in) the seed-forming layer (when it is porous, at least partly, or when ions have been implanted therein) or by the bonding interface (when its bonding energy is low).

After the separation between the recrystallized layer and the seed-forming layer, thermal annealing is advantageously applied to that recrystallized layer in order to eliminate therefrom the possible crystal defects still present (this annealing is advantageously carried out at the a temperature in general higher than that at which the recrystallization was carried out).

Finishing steps may be useful for the SOI structure so obtained, in order to obtain in particular a good surface state in terms of roughness, for example. They may thus be steps such as chemical mechanical polishing, annealing operations in a reducing atmosphere, under a vacuum, etc.

In the aforementioned it was implicitly indicated that the seed-forming layer was continuous and homogenous. This is not necessary for the implementation of the invention. Thus the invention may also be implemented with a seed-forming layer constituted by a discontinuous layer composed of nanowires (that is to say wires of diameter of the order of magnitude of the nanometer, or of a few nanometers, typically less than 5 nanometers), for example nanowires of silicon surrounded by silicon oxide, or else of $Si_xGe_{(1-x)}$.

By way of example, in the case of layers formed from silicon, the silicon nanowires are advantageously produced on a monocrystalline silicon substrate such that they all have the same crystalline information (see for example, "Kuiqing Peng, Ying Xu, Yin Wu, Yunjie Yan, Shuit-Tong Lee and Jing Zhu, small 2005, 1, N° 11, 1062-1067"). The method implemented is for example that described in:

Allon I. Hochbaum, Rong Fan, Rongrui He and Peidong Yang, NANO LETTERS 2005, Vol 5, No. 3, pp 457-460,
Kuiqing Peng, Juejun Hu, Yunjie Yan, Yin Wu, Hui Fang, Ying Xu, Shuit-Tong Lee and Jing Zhu, Adv. Funct. Mater. 2006, 16, 387-394.

Preferably, a layer of oxide is then deposited on the set of nanowires and, after a step of chemical mechanical polishing, a surface is obtained composed of oxide and crystalline silicon (on account of the wires being flush) as explained in "Volker Schmidt, Heike Riel, Stephan Senz, Siegfried Karg, Walter Riess, and Ulrich Gösele, small 2006, 2, No. 1, 85-88"

The hydrophobic bonding is next carried out on a layer of amorphous silicon, then annealing for recrystallization. The separation is next made within the composite oxide/nanowire layer, preferably, mechanically and/or chemically (dissolution of the oxide in HF for example). In order to facilitate the separation, it is possible to replace the silicon oxide which is around the nanowires by a layer having a lower mechanical strength, for example with $HfO_2$ or a twin layer composed of $HfO_2$ and of silicon oxide (the upper layer of silicon oxide enabling the chemical mechanical polishing to be facilitated to obtain a flat surface necessary for the molecular bonding).

As stated previously with regard to the seed-forming layers, the nanowires may be not of silicon but of another material such as germanium if it is desired to recrystallize the germanium (according to the usual crystal form of germanium).

It is also possible to make $Si_{(1-x)}Ge_x$ (x=0.2, for example) grow on the top of the silicon nanowires, an advantage of which is in particular to obtain $Si_{(1-x)}Ge_x$ with an relaxed lattice parameter and without stress within the nanowire. On recrystallization of the amorphous layer (for example of silicon), it is the parameter of the nanowires which serves as seed, which, after recrystallization and after separation, enables silicon to be obtained with a lattice parameter corresponding to the $Si_{(1-x)}Ge_x$, and thus with internal stress.

It can be understood that the interest in using nanowires, rather than a homogenous layer, to form the seed-forming layer is that the presence of several materials may facilitate the separation. The nanowires also enable the relaxed material to be easily deposited make it possible to obtain relaxed material easily.

BRIEF DESCRIPTION OF THE DRAWING

Objects, features and advantages of the invention will appear from the following description, given by way of illustrative non-limiting example with reference to the accompanying drawings in which.

DETAILED DESCRIPTION

First Example Embodiment

FIGS. 1 to 6 describe the steps of a first embodiment of the method of the invention, for the formation of a layer of monocrystalline silicon.

Figure 1:
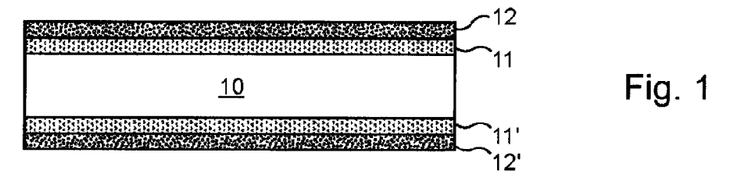
FIG. 1 is a cross-section view of a first substrate comprising on the surface a porous layer and which is destined for the implementation of the invention according to a first embodiment.

Commencement is made by preparing a first substrate comprising a support substrate 10, here constituted by a monocrystalline silicon wafer of 200 nm diameter, and, at the surface, an amorphous layer 12 of a first material, i.e. silicon. The carrier substrate was thermally oxidized in advance, for example by means of annealing in water vapor, for 2 h, to produce a layer 11 of silicon oxide of 400 nm thickness; the silicon layer, thermally oxidized, was then subjected to a deposition by CVD (chemical vapor deposition) at low temperature (approximately 400° C.) of amorphous silicon, until the desired layer 12 was formed, of thickness of the order of 50 nm here.

When the oxidation and the amorphous deposition are carried out in ovens collectively, the substrate, as illustrated in FIG. 1, comprises an oxide layer and an amorphous layer on each of its faces (referenced 11' and 12' on the lower face), but it should be understood that it would suffice for such layers 11 and 12 to exist on only one of the faces of the substrate 10.

Figure 2:
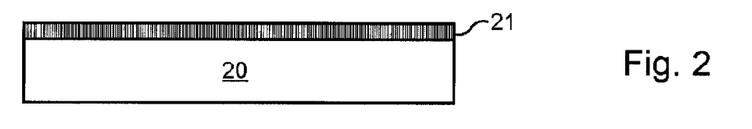
FIG. 2 is a cross-section view of a second substrate comprising a reference layer at the surface.

Using electrochemistry, a second substrate 20 is, here over only part of its thickness under a free surface, rendered porous, for example by treatment with an HF-based solution under appropriate conditions. This porous layer 21 has for example a thickness of 10 microns. This substrate 20 is advantageously a wafer similar to the wafer from which the first substrate 10 was formed. The configuration of FIG. 2 is thus obtained.

This second substrate 20 is monocrystalline, here with an orientation <001>. It is for example a 1 ohm.cm doped n-type silicon to which a current density of 400 $mA.cm^2$ has been applied without illumination at the back face.

Figure 3:
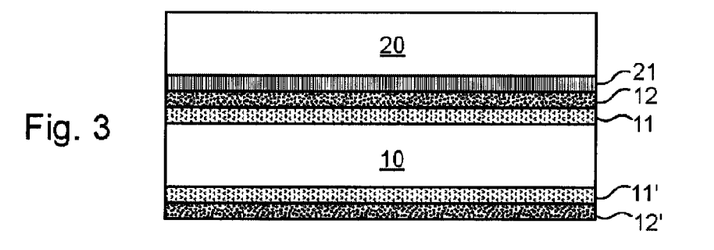
FIG. 3 is a cross-section view of an assembly, by molecular bonding, of the substrate of FIGS. 1 and 2.

After an optional treatment consisting here of a treatment by HF (in solution, or in vapor phase), the two free surfaces of the first and second substrate 10 and 20 (i.e. the free surfaces of the layers 12 and 21) are bonded by hydrophobic molecular bonding (the molecular bonding is sometimes termed "molecular adhesion"). The configuration of FIG. 3 is thus obtained.

Figures 4, 5, 6:
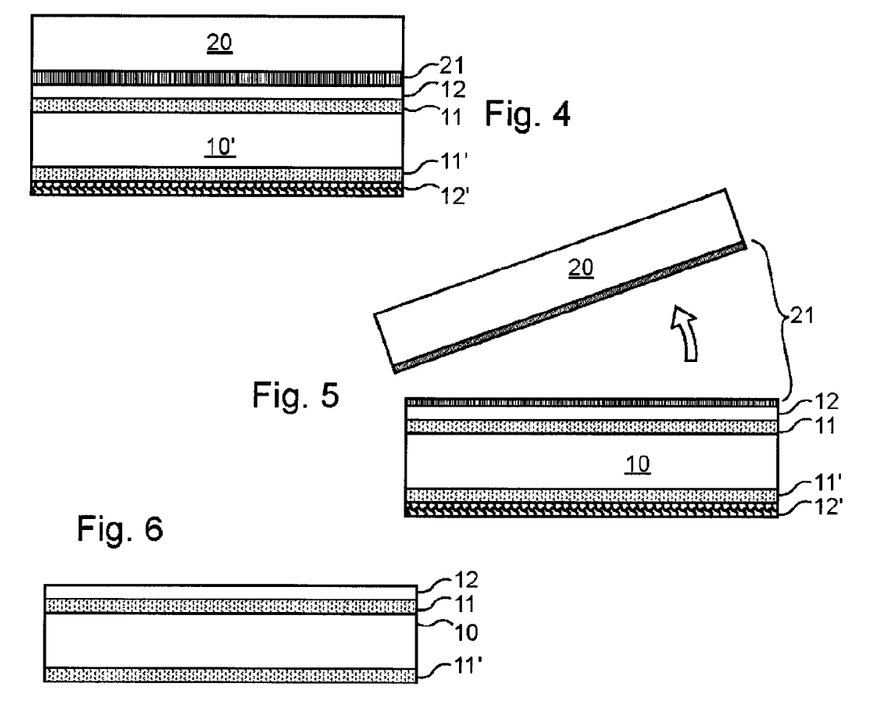
FIG. 4 is a cross-section view of this assembly after an operation of annealing for recrystallization.
FIG. 5 is a cross-section view of that assembly in course of separation.
FIG. 6 is a cross-section view of the first substrate after application of possible finishing steps.

Thermal annealing is next carried out in order to induce the recrystallization in solid phase of the amorphous layer 12 into monocrystalline silicon, according to the crystal parameters 21 which thus constitute, through the molecular bonding interface, a recrystallization seed-forming reference layer.

This annealing may for example consist of a temperature ramp of 0.5° C./min between 200° and 1200° C.

In fact, the effect of this annealing is not only to induce the recrystallization of the amorphous layer, but also to consolidate the molecular bonding interface.

It may be noted in FIG. 4 that, since the first substrate 10 is provided with an amorphous layer on each of its faces, the annealing treatment has induced the recrystallization of not only the layer 12 on its upper face, but also of the layer 12' on its lower face. However, since that layer 12' was not in contact with any seed-forming layer, it recrystallized in polycrystalline form.

As is represented diagrammatically in FIG. 5, the separation of the recrystallized layer (monocrystalline layer 12) from the layer 21 which served as reference for it for the recrystallization is next induced by any appropriate means.

In the example considered here, this separation is made within the porous layer 21, given that, in the absence of particular precautions to avoid too strong a consolidation of the bonding interface, (see the third example below), that porous layer is in practice mechanically more fragile than the bonding interface.

After this separation, the second substrate 20 only still comprises a part of the porous layer 21, whereas the other part of that porous has become joined to the first substrate 10+11+12 on account of the molecular bonding.

A finishing treatment is then applied, for example in the form of chemical mechanical or ionic polishing, so as to eliminate that residual part of the porous layer; according to needs, it is furthermore possible to eliminate, from the opposite face of the first substrate, the layer 12' recrystallized in polycrystalline form. A modified first substrate is thus obtained, comprising a monocrystalline layer 12 having crystalline characteristics (dimensions and orientation) set by those of the layer 21 chosen as reference layer to serve as recrystallization seed.

As regards the second substrate 20, it may be recycled in practice after elimination, for example by chemical removal, of the remains of the porous layer; on that substrate a new porous layer may then be formed destined to serve as recrystallization seed for an amorphous layer of a new first substrate, according to the same crystallization parameters, or not.

The thermal annealing for recrystallization may, as a variant, be carried out in two steps (or even more), of which a first step is sufficient to induce the recrystallization of a part, which may possibly be small, of the thickness of the amorphous layer starting from the interface. After separation, the recrystallization of the rest of the amorphous layer may be obtained, in one or more steps, using the recrystallized part as seed for the rest of the amorphous layer. The first step is for example a faster ramp than that mentioned above.

As a variant, the layers 12 and 12' are initially in polycrystalline form.

According to still another variant, the seed-forming layer is weakened in advance by an appropriate implantation of ions, so as to localize the future separation.

Second Example Embodiment

FIGS. 7 to 11 describe another embodiment of the method of the invention; in these FIG.s, the elements which are similar to those of FIGS. 1 to 6 are designated by reference numbers which are deduced from those of FIGS. 1 to 6 by addition of the number 100.

Figure 7:
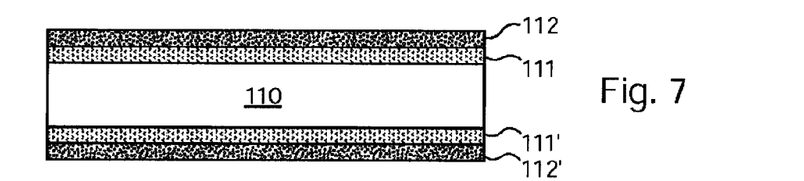
FIG. 7 is a cross-section view of another first substrate comprising on the surface a porous layer and which is destined for the implementation of the invention according to a second embodiment.

Thus this second example embodiment of the invention commences with the preparation of a first substrate 110 using the same operations as those that resulted in the first substrate 10 of the first example, that is to say:

thermal oxidation of a wafer 110 of monocrystalline silicon of 200 nm diameter, so as to form a stop layer 111 constituted by the oxide of the element constituting the carrier substrate, deposit on the oxide layer of a layer of amorphous silicon, for example of 50 nm thickness.

As in the first example, the wafer 110 has extending along each of its faces an oxide layer 111 or 111' then a layer of amorphous silicon 112 or 112'.

Figure 8:
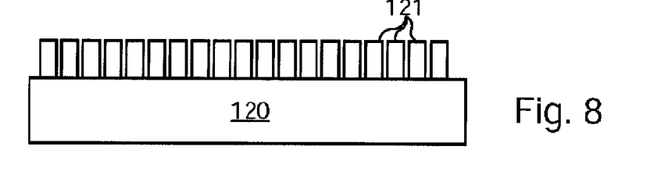
FIG. 8 is a cross-section view of another second substrate destined to comprise a reference layer at the surface.

On a second wafer 120, here of silicon, for example identical to the support wafer 20 of the first example, nanowires of monocrystalline silicon 121 are formed (i.e. without any intermediate layer between those nanowires and that wafer). These nanowires are for example formed in the manner described in "Allon I. Hochbaum, Rong Fan, Rongrui He and Peidong Yang, NANO LETTERS 2005 Vol 5, N° 3, pp. 457-460" or in "Kuiqing Peng, Juejun Hu, Yunjie Yan, Yin Wu, Hui Fang, Ying Xu, ShuitTong Lee and Jing Zhu, Funct. Mater. 2006, 16 387-394". The configuration of FIG. 8 is thus obtained.

It is to be noted that these monocrystalline wires, formed on the wafer 120, all have the same orientation, i.e. that which was conferred to them by the underlying wafer; it follows therefrom that, conjointly, these nanowires form a monocrystalline layer, albeit discontinuous.

These nanowires are parallel to each other and their separation is advantageously less than that of their transverse dimensions, such that this discontinuous layer 121 is in the overwhelming majority formed by the material constituting those nanowires, typically by more than two thirds, or even more than three-quarters.

Figure 9:
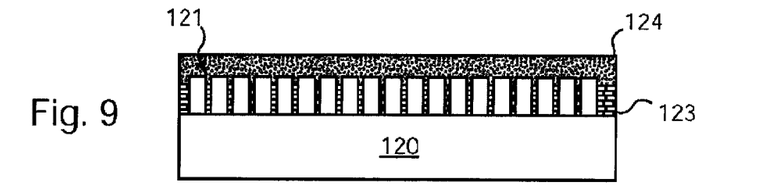
FIG. 9 is a cross-section view of that second substrate after a first step of preparation.

As is represented in FIG. 9, a first oxide 123 is deposited between the nanowires, then a second oxide 124 which covers the nanowires. In the example represented, the first oxide is hafnium oxide, $HfO_2$, whereas the second oxide is silicon oxide.

So as to enable the nanowires to act as recrystallization seeds, a planarization treatment is applied to the structure of FIG. 9 so as to expose those nanowires 121.

The end surface of the nanowires thus exposed, conjointly with the oxide 124 situated between those nanowires, is then assembled, by hydrophobic molecular bonding, so as to ensure good transmission of the crystallographic information, to the free surface of the amorphous layer 112, then an annealing treatment is applied to the assembled structure, which is for example identical to the treatment applied in the first example, adapted to induce the recrystallization of the layer 112 (and of the layer 112' when it exists); given the molecular bonding between the amorphous layer 112 and the nanowires of monocrystalline silicon, this amorphous layer recrystallizes according to the crystalline parameters of those nanowires, according to their common crystal form. This is illustrated diagrammatically in FIG. 10.

Figure 10:
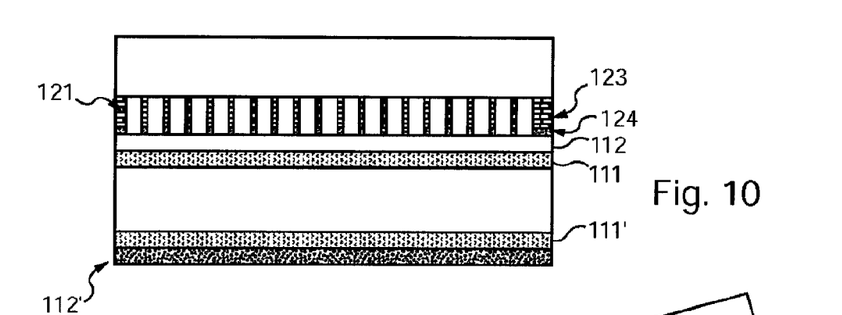
FIG. 10 is a cross-section view of that second substrate after a second step of preparation and assembly to the first substrate of FIG. 7, by molecular bonding.

In FIG. 10 it may be noted that, in the example represented, the second substrate comprises two oxides between the nanowires, respectively denoted 123 and 124, between which may be shared out the roles of recrystallization seeds and weak zone for the later separation (see above).

Figure 11:
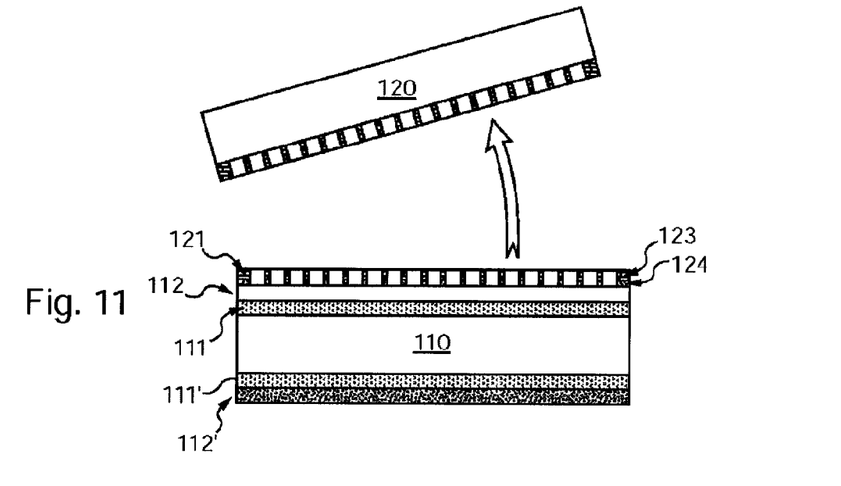
FIG. 11 is a cross-section view of that assembly in course of separation.

As is represented in FIG. 11, a separation treatment is then applied, here within the (discontinuous) layer formed of hafnium oxide which is less strong mechanically than the layer of silicon oxide and, unless particular precautions are taken at the time of the molecular bonding, than the interface resulting from that bonding.

As in the first example, the part of the nanowires and of the silicon oxide which is joined to the first substrate may then be eliminated by specific chemical attack, for example by wet HF attack.

As a variant, the separation may be obtained by selective chemical attack of the material extending along the nanowires and the bonding interface, here the silicon oxide layer by an attack with HF for example, so as to facilitate the fracture within the nanowires, or even between the ends of those nanowires and the recrystallized layer.

According to still another variant, one of the surfaces destined to undergo molecular bonding is roughened, for example by the formation of overetching in the silicon oxide of the second substrate, having as effect that the molecular bonding is selectively formed opposite the nanowires, which thus constitute bridges or pillars for connection between the substrates; the fact of making the silicon patterns appear has as advantage the fact of localizing the molecular bonding to a well-controlled part of the free surface of the second substrate, which enables the mechanical strength of the bonding interface to be controlled, and thus to delimit the level of energy which it is necessary to supply to obtain a separation at the location of that bonding interface.

Such overetching is, for example, carried out by attack by 1% HF in the case of a silicon oxide (an attack for 2 minutes removes approximately 12 nm of oxide without significantly attacking the silicon of the nanowires).

As in the first example, the annealing for recrystallization may be carried out in two steps separated by the separation step; similarly, the layer to recrystallize may initially be polycrystalline.

Third Example Embodiment

Figure 12:
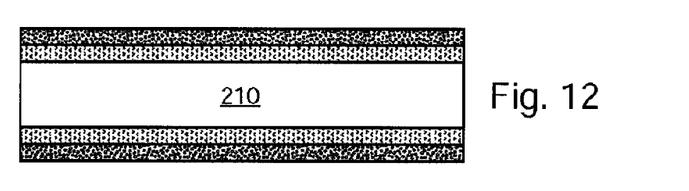
FIG. 12 is a cross-section view of still another first substrate destined for the implementation of the invention according to a third embodiment.
Figure 13:
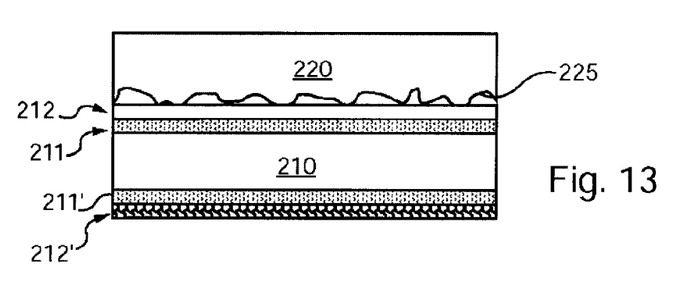
FIG. 13 is a cross-section view of an assembly of that first substrate of FIG. 12 and of a second substrate having undergone a roughening treatment.
Figure 14:
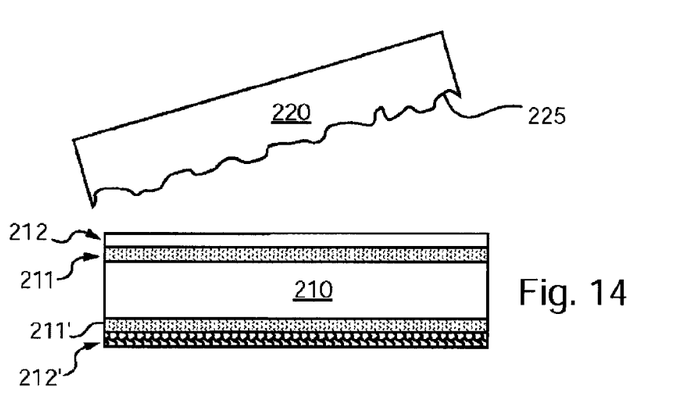
FIG. 14 is a cross-section view of that assembly in course of separation.

FIGS. 12 to 14 diagrammatically represent a third embodiment of the method of the invention. In these FIG.s, the elements that are similar to those of FIGS. 1 to 6 are designated by reference signs which can be deduced from those used on those FIG.s by the addition of the number 200.

In this example, a first substrate 210 is prepared in the same way as the first substrate 10 and 110 of the previous examples. This first substrate thus comprises a carrier substrate 210 which has, extending along both of its faces, an oxide layer 211 and 211', as well as a layer of amorphous silicon 212 and 212'.

A roughening treatment is then applied to the free surface of a second substrate 220, which may be the free surface of that second substrate itself (that is to say without any added on layer), so as to degrade in controlled manner the mechanical strength of the interface which will be obtained by hydrophobic molecular bonding (for optimum transmission of the crystallographic information). By way of example, when that second substrate is of silicon, this roughening is obtained by attack with a solution of water, ammonium hydroxide and hydrogen peroxide ($H_2O$, $NH_4^+/OH^-$ and $H_2O_2$) in proportions of 1-1-5, at 70° C. for 10 min, which makes it possible to obtain roughness of 0.2 nm RMS approximately (measured by AFM over a region of 5 microns×5 microns).

This roughness obtained is represented, in very exaggerated form, with the reference 225 in FIG. 13.

It is also possible, as a variant or in addition, to modify the roughness of the free surface of the amorphous layer.

The roughness of the two surfaces must not, in practice, exceed 0.4 nm RMS, so as not to significantly hinder the molecular bonding.

It is possible to control the surface roughness by alternating smoothing treatments (such as the chemical mechanical polishing CMP) annealing treatments under ultra-high vacuum at high temperature (>1000° C.), or annealing operations under hydrogen partial pressure at high temperature (>600° C.) and roughening treatments, such as the one mentioned above based on ammonium hydroxide, or chemical attacks based on diluted HF, $HF/HNO_3$, $HF/CrO_3$, TMAH (Tetra Methyl Ammonium Hydroxide), or $HF/CH_3COOOH$ (peracetate). Of course the heat treatments at high temperature must not be applied to the amorphous layer so as not to recrystallize it in polycrystalline form before the molecular bonding.

The two surfaces are next bonded by molecular bonding of hydrophobic type. In the case of silicon it is a matter of terminating the preparation of the surfaces, for example by a chemical attack with a HF-based solution in order to obtain surface functionalization of Si—H type. The two surfaces free from silicon oxide, and of which the endings are of Si—H type are then placed in contact.

A thermal budget is applied (defined by at least one duration/temperature pair) adapted, as previously, to induce, or at least commence, the recrystallization.

It can be understood that the later separation (see FIG. 14) may then be obtained, at the bonding interface, for example by application of a mechanical tool, such as a blade the insertion of which is attempted at that interface. Other types of separation may also be envisaged, by applying for example a bending force to the structure, or by projecting a localized jet of liquid or gas, or by means of ultrasound, in particular.

After the separation, another thermal budget may be applied to finish the monocrystalline recrystallization, where that had only just begun during the first thermal budget.

The finishing of the first substrate is simplified relative to the previous examples by the fact that it is no longer necessary to eliminate a residual part of the second substrate.

It can be understood from the above that the invention may apply to other materials, in particular germanium or silicon-germanium alloys, but also to alloys for groups III-V of the periodic table of the elements, by adapting the bonding conditions and the recrystallization treatment, or even treatment of the surfaces, in accordance with the general knowledge of the person skilled in the art.

In the above examples, the amorphous layer is recrystallized to a thickness of several tens of nanometers, but it is to be understood that the invention applies to the formation of monocrystalline layers which are much thicker, according to needs, without having the known technological limitations; thus the invention enables in particular the formation of monocrystalline layers of several microns thickness, or even thicker than ten or so microns.

The invention claimed is:

1. A method of forming a thin layer of a given material, the method comprising,
   preparing a first substrate comprising, on the surface, a material layer comprising an amorphous or polycrystalline layer, or both of the given material;
   bonding a second substrate to the first substrate by hydrophobic molecular bonding, the second substrate comprising a surface monocrystalline reference layer having a given crystallographic orientation;
   applying a heat treatment to at least to the material layer, the heat treatment adapted to induce the recrystallization in solid phase of at least part of the material layer following the crystallographic orientation of the reference layer, the reference layer acting as a recrystallization seed, and
   separating the at least partly recrystallized material layer from at least part of the reference layer.

2. A method according to claim 1, wherein preparing the first substrate comprises preparing the material layer to extend along an underlying layer that is adapted not to recrystallize at the time of applying the heat treatment.

3. A method according to claim 2, wherein the underlying layer comprises an oxide layer.

4. A method according to claim 3, wherein the underlying layer comprises a layer of a thermal oxide of substantially the same material as the material layer.

5. A method according to claim 1, wherein preparing the first substrate comprises depositing the material layer collectively over several substrates within the same oven.

6. A method according to claim 1, wherein the molecular bonding and the heat treatment for recrystallization are such that the second substrate comprises, along a bonding interface with the first substrate, a zone in which the mechanical strength is less than that of the bonding interface.

7. A method according to claim 1, wherein the reference layer comprises a porous zone over at least part of its thickness, and wherein the separating is induced within the porous zone.

8. A method according to claim 1, further comprising applying a surface treatment to one of a bonding face of the first or second substrate so as to increase the roughness thereof, and wherein the separating is induced at a bonding interface of the first and second substrates.

9. A method according to claim 8, wherein the surface treatment creates a roughness between 0.1 nm RMS and 1 nm RMS.

10. A method according to claim 1, wherein the reference layer comprises a network of monocrystalline nanowires having the same orientation and the same crystallographic dimensions.

11. A method according to claim 10, wherein the reference layer further comprises, between the nanowires, at least one layer extending along a molecular bonding interface and a layer having a mechanical strength less than that of the layer extending along the interface and less than that of the interface.

12. A method according to claim 1, wherein the reference layer comprises a different material from that of the material layer, such that the material layer recrystallizes in a stressed state.

13. A method according to claim 1, wherein the material layer and the reference layer comprise materials selected from silicon, germanium, or their alloys.

14. A method according to claim 1, wherein applying the heat treatment comprises applying a heat treatment that is adapted to induce the recrystallization of only part of the material layer and, wherein the method further comprises applying a second heat treatment after separating that completes the recrystallization of the material layer.

15. A method according to claim 1, further comprising applying an annealing treatment after separating to eliminate crystallization defects resulting from the recrystallizing of at least part of the material layer.

* * * * *